(12) United States Patent
Nagulapalli et al.

(10) Patent No.: US 11,757,355 B1
(45) Date of Patent: Sep. 12, 2023

(54) CLOCK DATA RECOVERY CIRCUIT INCLUDING CHARGE PUMP HAVING REDUCED GLITCH CURRENT

(71) Applicant: Marvell Asia Pte, Ltd., Singapore (SG)

(72) Inventors: Rajasekhar Nagulapalli, Northampton (GB); Simon Forey, Northamptonshire (GB); Parmanand Mishra, Cupertino, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/539,878

(22) Filed: Dec. 1, 2021

Related U.S. Application Data

(63) Continuation of application No. 17/014,268, filed on Sep. 8, 2020, now abandoned, which is a continuation of application No. 16/284,633, filed on Feb. 25, 2019, now Pat. No. 10,804,797.

(51) Int. Cl.
*H02M 3/07* (2006.01)
*H03L 7/089* (2006.01)
*H04L 7/033* (2006.01)

(52) U.S. Cl.
CPC ............ *H02M 3/07* (2013.01); *H03L 7/0891* (2013.01); *H04L 7/033* (2013.01)

(58) Field of Classification Search
CPC ............ H02M 1/00; H02M 1/15; H02M 3/00; H02M 3/07; H03L 7/00; H03L 7/0807; H03L 7/0891; H03L 7/0893; H03L 7/0895; H03L 7/0896; H03L 7/091; H03L 7/18; H04L 7/00; H04L 7/033
USPC ........................................................ 327/157
See application file for complete search history.

(56) References Cited

U.S. PATENT DOCUMENTS

| | | | |
|---|---|---|---|
| 6,259,612 B1 * | 7/2001 | Itoh .......................... | H02M 3/07 363/60 |
| 2006/0097772 A1 | 5/2006 | Sakiyama et al. | |
| 2009/0167579 A1 | 7/2009 | Kawano | |
| 2012/0200327 A1 * | 8/2012 | Sreekiran .............. | H03L 7/0896 327/552 |
| 2012/0218049 A1 | 8/2012 | Sawada | |
| 2018/0316524 A1 * | 11/2018 | Cohen ............... | H04L 25/03949 |
| 2019/0089361 A1 * | 3/2019 | Wang .................... | H04L 7/0087 |
| 2020/0059348 A1 | 2/2020 | Forey et al. | |

* cited by examiner

*Primary Examiner* — Diana J. Cheng
*Assistant Examiner* — Dave Mattison

(57) ABSTRACT

The present invention is directed to electrical circuits. According to an embodiment, the present invention provides a charge pump circuit with a bias section and a switch section. The switch section includes a first switch coupled to an early signal and a second switch coupled to a late signal. The charge pump additionally includes a low-pass filter. The switch section includes a first resistor and a second resistor. The first resistor is directly coupled to the first switch and the low-pass filter. The second resistor is directly coupled to the second switch and the first resistor. There are other embodiments as well.

19 Claims, 8 Drawing Sheets

-- Prior Art --

CLOCK DATA RECOVERY CIRCUIT INCLUDING CHARGE PUMP HAVING REDUCED GLITCH CURRENT

CROSS-REFERENCES TO RELATED APPLICATIONS

The present disclosure is a continuation of U.S. patent application Ser. No. 17/014,268 filed on Sep. 8, 2020, which is a continuation of U.S. patent application Ser. No. 16/284,633 filed on Feb. 25, 2019 (now U.S. Pat. No. 10,804,797). The entire disclosures of the applications referenced above are incorporated herein by reference.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer ("SERDES" or "SerDes") with clock and data recovery (CDR) modules are often used.

Over the past, there have been many types of communication systems and methods. Unfortunately, they have been inadequate for various applications. More specifically, existing CDR devices are often inadequate in various applications. Therefore, improved systems and methods are desired.

BRIEF SUMMARY OF THE INVENTION

The present invention is directed to electrical circuits. According to an embodiment, the present invention provides a charge pump circuit with a bias section and a switch section. The charge pump additionally includes a low-pass filter. The switch section includes a first switch coupled to an early signal and a second switch coupled to a late signal. The switch section includes a first resistor and a second resistor. The first resistor is directly coupled to the first switch and the low-pass filter. The second resistor is directly coupled to the second switch and the first resistor. There are other embodiments as well.

According to an embodiment, the present a charge pump circuit that includes a bias section that is configured to generate a first bias signal and a second bias signal. The charge pump circuit also includes a low-pass filter. The charge pump circuit additionally includes a switch section for generating a charge current. The switch section includes a first switch coupled to an early signal. The switch section also includes a first resistor directly coupled to the first switch and the low-pass filter. The switch section additionally includes a second switch coupled to a late signal. The switch section further includes a second resistor directly coupled to the second switch and the low-pass filter.

According to another embodiment, the present invention provides a charge pump circuit that has a bias section configured to generate a first bias signal and a second bias signal. The bias section is coupled to a digital-to-analog converter. The charge pump circuit also includes a low-pass filter. The charge pump circuit additionally includes a switch section for generating a charge current. The switch section includes a first switch coupled to an early signal. The switch section also includes a first resistor directly coupled to the first switch and the low-pass filter.

According to yet another embodiment, the present invention provides a charge pump circuit that includes a bias section configured to generate a first bias signal and a second bias signal. The charge pump circuit injects charge onto a low-pass filter. The charge pump circuit additionally includes a switch section for generating a charge current. The switch section includes a first switch coupled to an early and late signal. The switch section also includes a first resistor directly coupled to the first switch and the low-pass filter. The switch section further includes a capacitance directly coupled to the first switch and the first resistor.

It is to be appreciated that embodiments of the present invention provide many advantages over conventional techniques. Among other things, charge pump circuits according to embodiments of the present invention effectively reduce undesirable glitch currents. When integrated into CDRs and related applications, charge pumps according to the present invention effectively improve device and application performance and time response.

Embodiments of the present invention can be implemented in conjunction with existing systems and processes. For example, charge pump devices according to embodiments of the present invention can be manufactured using existing manufacturing processes, and they can be incorporated into various types of CDR designs. In addition, charge pumps according to embodiment of the present invention can be incorporated into other types of circuits and designs as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits. According to an embodiment, the present invention provides a charge pump circuit with a bias section and a switch section. The switch section includes a first switch coupled to an early signal and a second switch coupled to a late signal. The charge pump additionally includes a low-pass filter. The switch section includes a first resistor and a second resistor. The first resistor is directly coupled to the first switch and the low-pass filter. The second resistor is directly coupled to the second switch and the first resistor. There are other embodiments as well.

Figure 1:
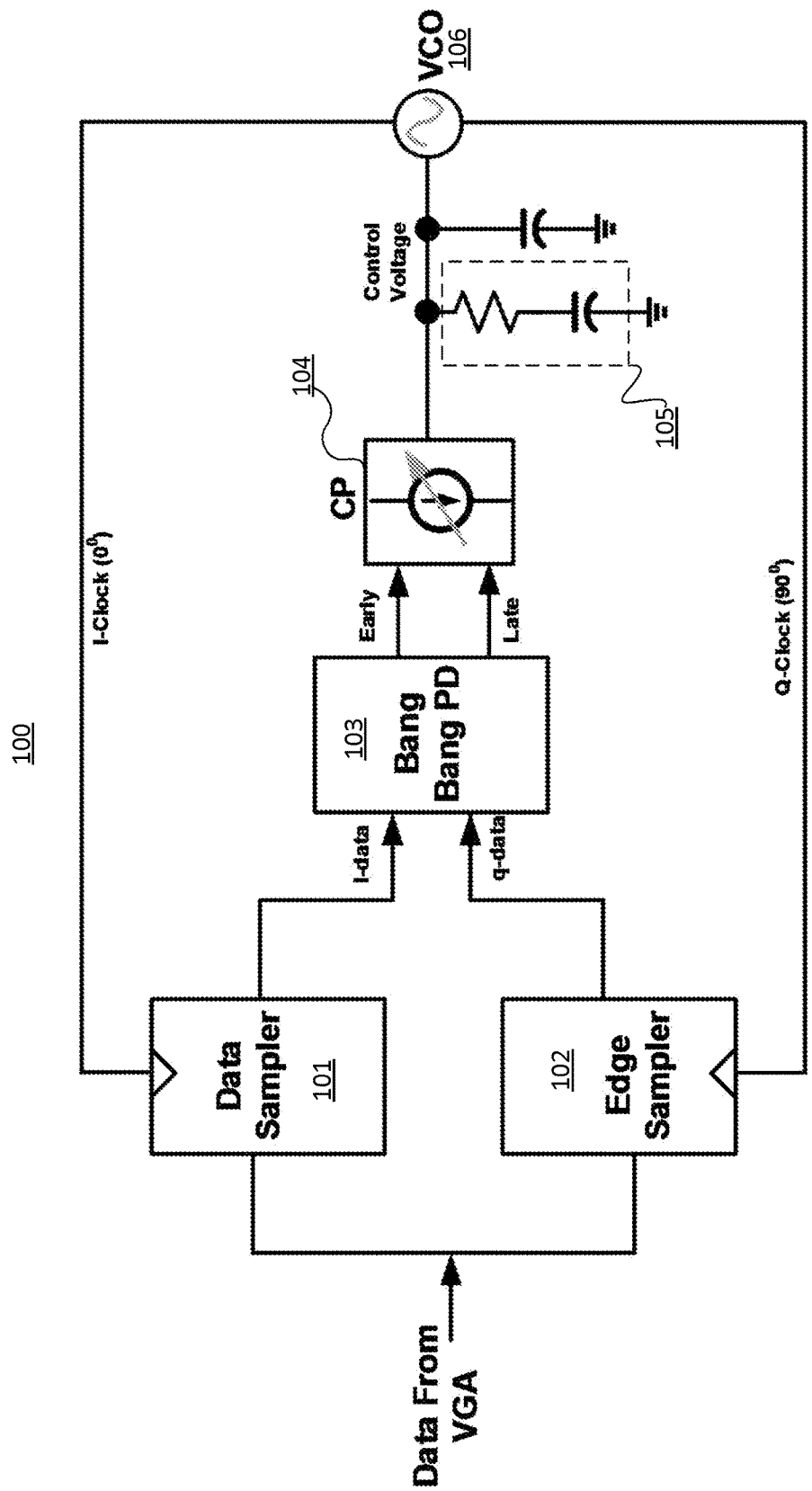
FIG. 1 is a simplified diagram illustrating a clock data recovery circuit 100.

As mentioned above, clock data recovery (CDR) circuits have a wide range applications. For example, CDR is widely used in data transfer and data communication. In a CDR implementation, a charge pumps takes the output of a phase detector and converts into a current signal. FIG. 1 is a simplified diagram illustrating a clock data recovery circuit 100. For example, charge pump circuits according to embodiments of the present invention can be deployed in the CDR circuit 100. The CDR circuit 100 receives data from a variable gain amplifier (VGA). The CDR circuit 100 samples the received data with its data sampler 101 and edge sampler 102. Data sampler 101 generates I-data (in-phase) and edge sampler 102 generates Q-data (quadrature). Phase detector 103 performs phase detection (e.g., using a Bang-Bang phase-detector) using the I-data and q-data respectively received from data sampler 101 and the edge sampler 102. Based on the phase detection, phase detector 103 generates an early signal and a late signal, which are transmitted to charge pump 104. Together, the data sampler and the edge sampler approximate the phase of the clock with respect to the data. For example, the data sampler and the edge sampler can be implemented using sense-amplifier based regeneration flip-flops. For example, data sampler 101, edge sampler 102, and phase detector 103 are considered the first stage of the CDR circuit 100, while the charge pump is considered the second stage of the CDR circuit. Charge pump 104 is configured to generate control voltage for the voltage-controlled oscillator (VCO) 106. VCO 106 generates a clock signal based on the control voltage. For example, charge pump 104 may be implemented according to embodiments of the present invention. The charge pump (CP) 104 uses the early/late signal from the phase detector (PD) to generate and inject a controlled amount of charge onto the loop filter (LPF), and the filtered signal is used to drive the VCO to the correct frequency and phase. The clock output from the VCO 106 is provided to the data sampler and the edge sampler for phase correction. The VCO 106 generates clock signals for both data sampler 101 (I-clock signal) and edge sampler 102 (Q-clock signal).

Based on the early/late signals from Phase detector, charge pump 104 injects a controlled amount of charge onto the loop filter 105. For good performance, the amount of charge from the charge pump 104 should be same in early phase and late phase, as mismatch in the amount of charge would create static phase offset between the incoming data and VCO clock. As the Bang-Bang phase detector switches from early to late or late to early, the charge pump would introduce charge glitches. Mismatch or incorrect amount of charge would create undesirable phase offset between the clock edge and center of the data eye. During the switching from one phase to another phase, the amount of glitch charge introduced into the loop filter should be very small relative to the actual charge that is used to operate the VCO 106. It is to be appreciated that embodiments of the present invention effectively reduces undesirable charge glitches at the charge pump.

Figure 2:
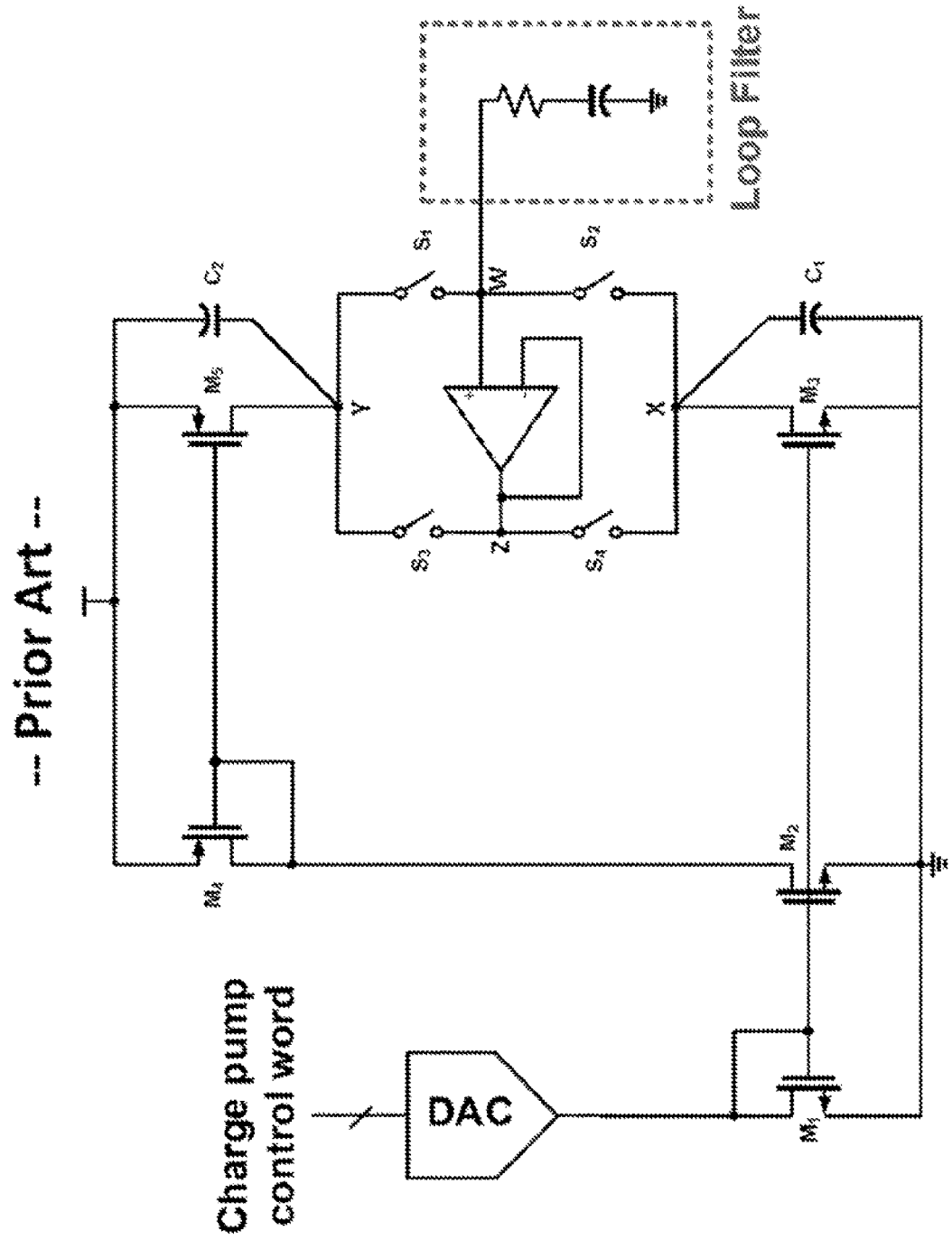
FIG. 2 is a diagram illustrating a conventional charge pump circuit with current control.

FIG. 2 is a diagram illustrating a conventional charge pump circuit with gain control. The behavior the charge pump circuit in FIG. 2 is controlled by the switches. When the late signal is "high", switches $S_1$ and $S_4$ are on and charge pump current (the current of transistor $M_5$) is injected into the loop filter and charges the filter. When the early signal is "high", switches $S_2$ and $S_3$ are on and charge pump current (current of transistor $M_3$) flows out of the loop filter and discharges the filter. The operational amplifier of the charge pump reduces the charge sharing between the node Z and W during current switching. Unfortunately, there are various drawbacks with the charge pump implementation illustrated in FIG. 2. The sizes of transistors $M_5$ and $M_3$ depend on the mismatch requirement between currents. Generally, these transistors are bulky components of the circuit. The bulky size of transistors $M_5$ and $M_3$ often leads to undesirable (and often significant) parasitic at node X (e.g., capacitor $C_1$) and node Y (e.g., capacitor $C_2$). During early/late switching, glitch current resulting from charging/discharging of capacitor $C_1$ and capacitor $C_2$ can be high, and hence this architecture is at least unsuitable for low current high linear charge pump. It is also be noted that charge pump noise depends on the transconductance of transistors $M_5$ and $M_3$. The noise attribute to the charge pump usually contributes significant amount to the overall CDR jitter. To address this issue, a low noise architecture is implemented by relying on substantially noise-less resisters and transistor currents.

Figure 3:
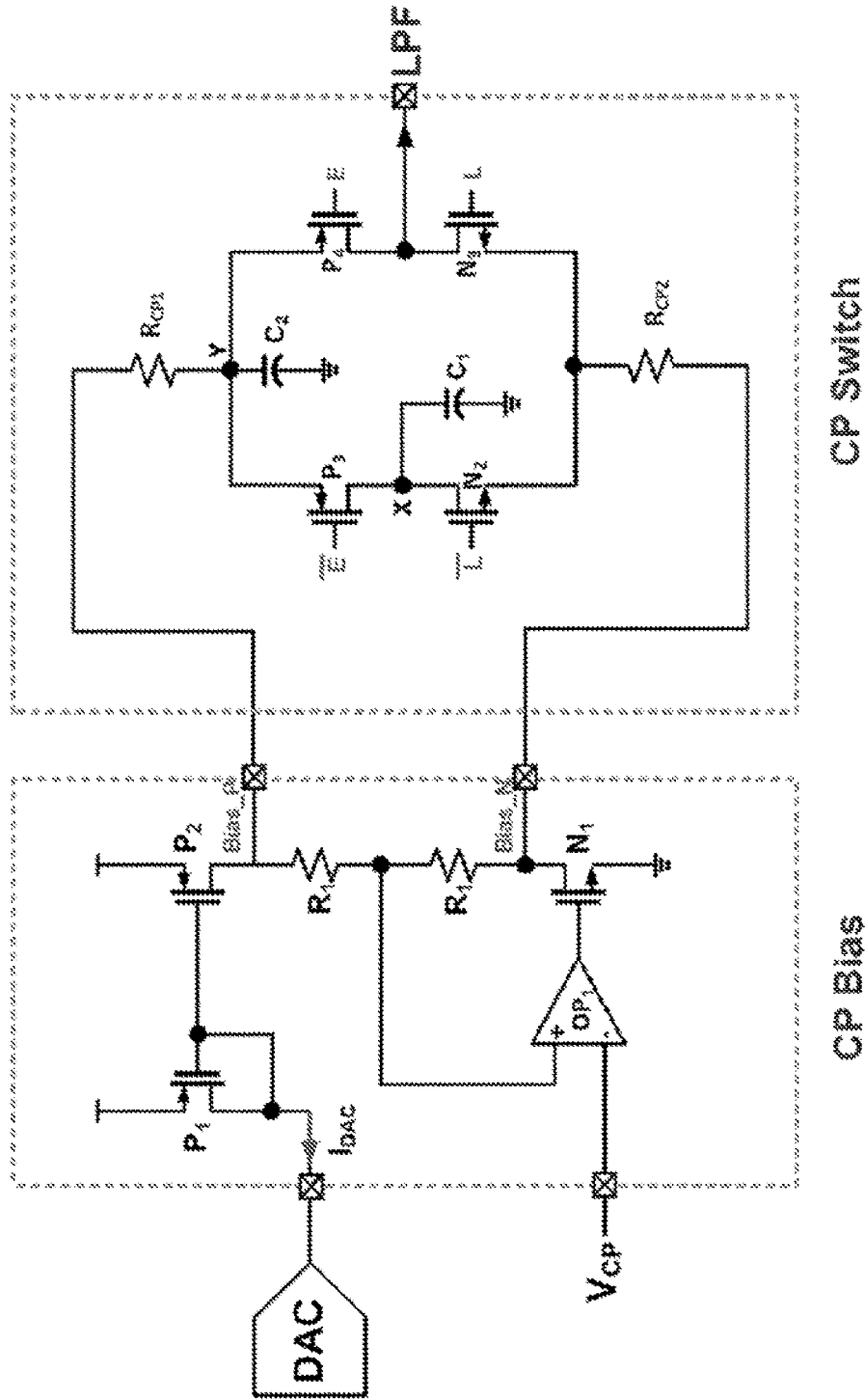
FIG. 3 is a diagram illustrating another conventional charge pump circuit.

FIG. 3 is a diagram illustrating another conventional charge pump circuit. The charge pump circuit includes two sections: "CP Bias" and "CP Switch". The CP Bias section creates a pair of differential voltages (Bias_p and Bias_n as shown) around the loop filter output voltage as common mode. Node voltages bias_p and bias_n are fully differential bias voltages and their magnitudes can be controlled by the DAC. The opamp ($op_1$) at the CP Bias section adjusts the NMOS ($N_1$) current to be equal to the DAC current. The operation of the CP Switch section is based on the early ("E") and late ("L") signals, and it converts bias_p and bias_n voltages into current. For example, the charge put current Icp can be expressed in the equation bellow:

$$I_{CP} = \frac{V_{Bias\_p} - V_{CP}}{R_{CP}}$$

There are drawbacks associated with the charge pump illustrated in FIG. 3. During the transitions between Early/Late, node Y is disconnected from node X and connected to the loop filter (LFP) output. As a result, the parasitic capacitance $C_2$ would share the charge from loop filter capacitor $C_1$. This charging current is usually undesirably spiky, as there is no resistance in this path with the parasitic capacitor $C_2$. The charge from the parasitic capacitor $C_2$ would be added to the charge-pump current.

Figure 4:
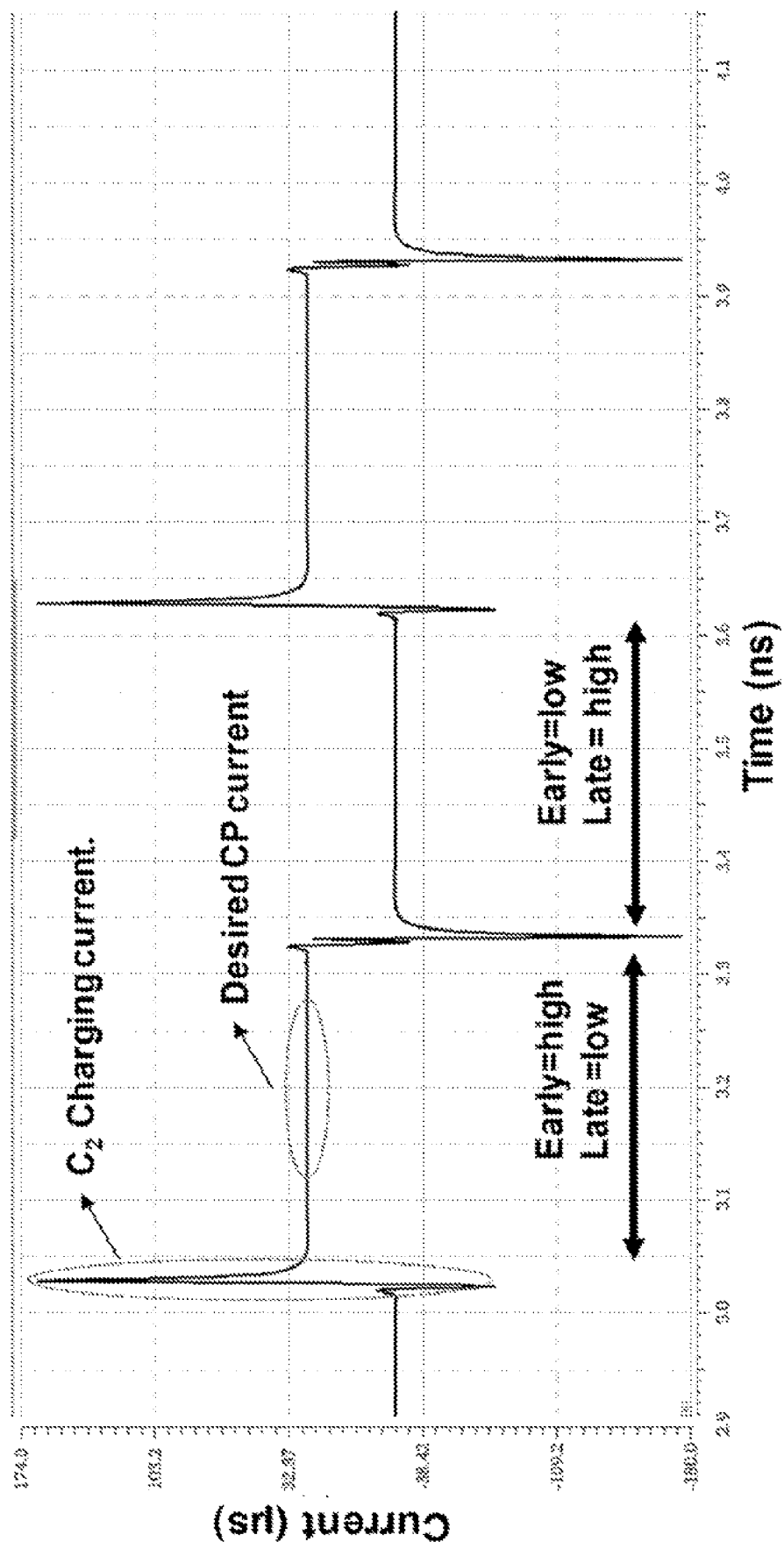
FIG. 4 is a graph illustrating performance of conventional charge pump implantations as illustrated in FIG. 3.

FIG. 4 is a graph illustrating performance of conventional charge pump implantations as illustrated in FIG. 3. When Early is high and Late is low, the current is positive, and vice versa. The desired current is about 23 µA, but the current spikes causes capacitance $C_2$ charging to about 170 µA, which is undesirable for causing non-linearity and mismatch. The undesirable current is somewhat limited by the parasitic resistance in the charging path. It is to be appreciated that embodiments of the present invention effectively reduce the parasitic capacitance and improve charge pump performance.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 5A:
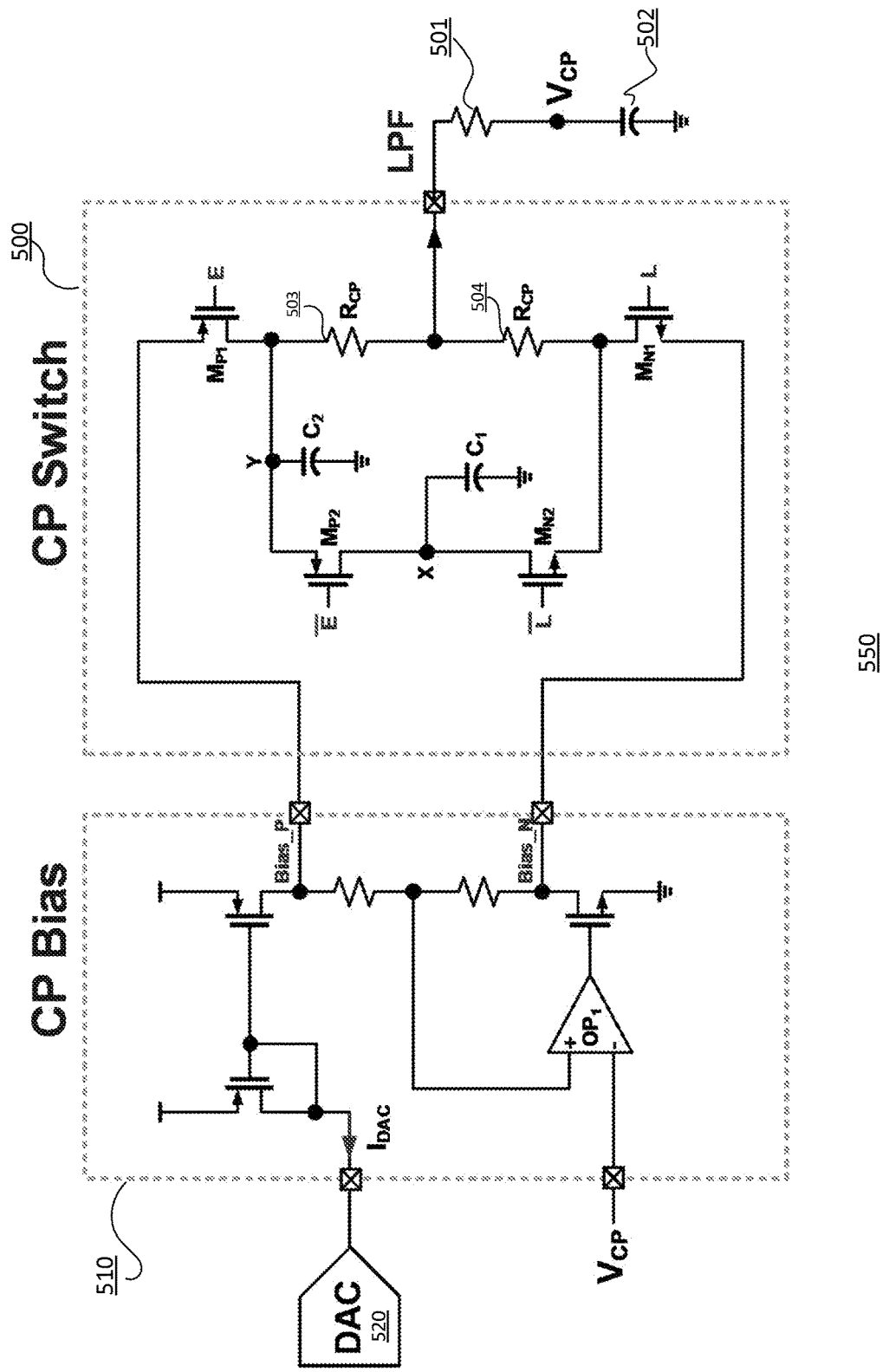
FIG. 5A is a simplified diagram illustrating an exemplary charge pump circuit according to embodiments of the present invention.

FIG. 5A is a simplified diagram illustrating an exemplary charge pump circuit 550 according to embodiments of the present invention. This diagram is merely an example, which should not unduly limit the scope of the claims. One of ordinary skill in the art would recognize many variations, alternatives, and modifications. A charge pump switch (CP Switch) section 500 receives bias signals Bias_P and Bias_N from the charge pump bias (CP Bias) section 510. CP Bias section 510 receives control signal from DAC 520, which as shown provides a current IDAC. Bias section 510 is additionally coupled to voltage VCP. Bias section 510 generates bias signals Bias_P and Bias_N as outputs. The charge pump section 500 receives the bias signals and generates an output current that is coupled to the loop filer (LPF). It is to be appreciate that charge pump section 500 generates much less undesirable glitch current compared to conventional charge pump designs.

As shown in FIG. 5A, Bias_P signal is coupled to the source of switch $M_{P1}$ (implemented with a PMOS transistor), which is controlled by the early signal "E" coupled to its gate. Bias_N signal is coupled to the source of switch $M_{N1}$ (implemented with an NMOS transistor), which is controlled by the late single "L" coupled to its gate. It is to be noted that the drains of transistors $P_4$ and $N_3$ in FIG. 3 are directly connected to each other and connected to the low-pass filter (LPF). For charge pump 550, the drain of switch $M_{P1}$ is coupled to charge pump resistor $R_{CP}$ 503, and the drain of switch $M_{N1}$ is coupled to the charge pump resistor $R_{CP}$ 504. It is also to be noted that resistors 503 and 504 are not directly coupled to bias signals Bias_P and Bias_N. Resistor 503 is connected to capacitance $C_2$ via node Y as shown. At node Y, Bias_P signal needs to go through switch $M_{P1}$ before reaching resistor 503 and capacitor $C_2$. As explained above, undesirable parasitic capacitance is attributed to glitch charges from the low-pass filter (LPF) to capacitor $C_2$. As shown, the LPF include resistor 501 and capacitor 502 and has a charge pump voltage of $V_{CP}$. It is to be appreciated that resistor 503 effectively limits the amount of charge flows from LPF to capacitor $C_2$ to a substantially negligible level, and the spike current from LPF (as shown in FIG. 4) is substantially minimized.

CP Switch section 500 additionally includes PMOS switch $M_{P2}$. The source terminal of switch $M_{P2}$ is coupled to node Y. The gate of switch $M_{P2}$ is coupled to the inverted early signal as shown. An NMOS switch $M_{N2}$ is coupled to switch $M_{N1}$. More specifically, the drain of switch $M_{N1}$ is coupled to the source of switch $M_{N2}$. Switch $M_{N2}$ is operated by the inverted late signal, which is coupled to its gate. Switch $M_{P2}$ and switch $M_{N2}$ share their drains at node X, which is also coupled to capacitor $C_1$.

Figure 5B:
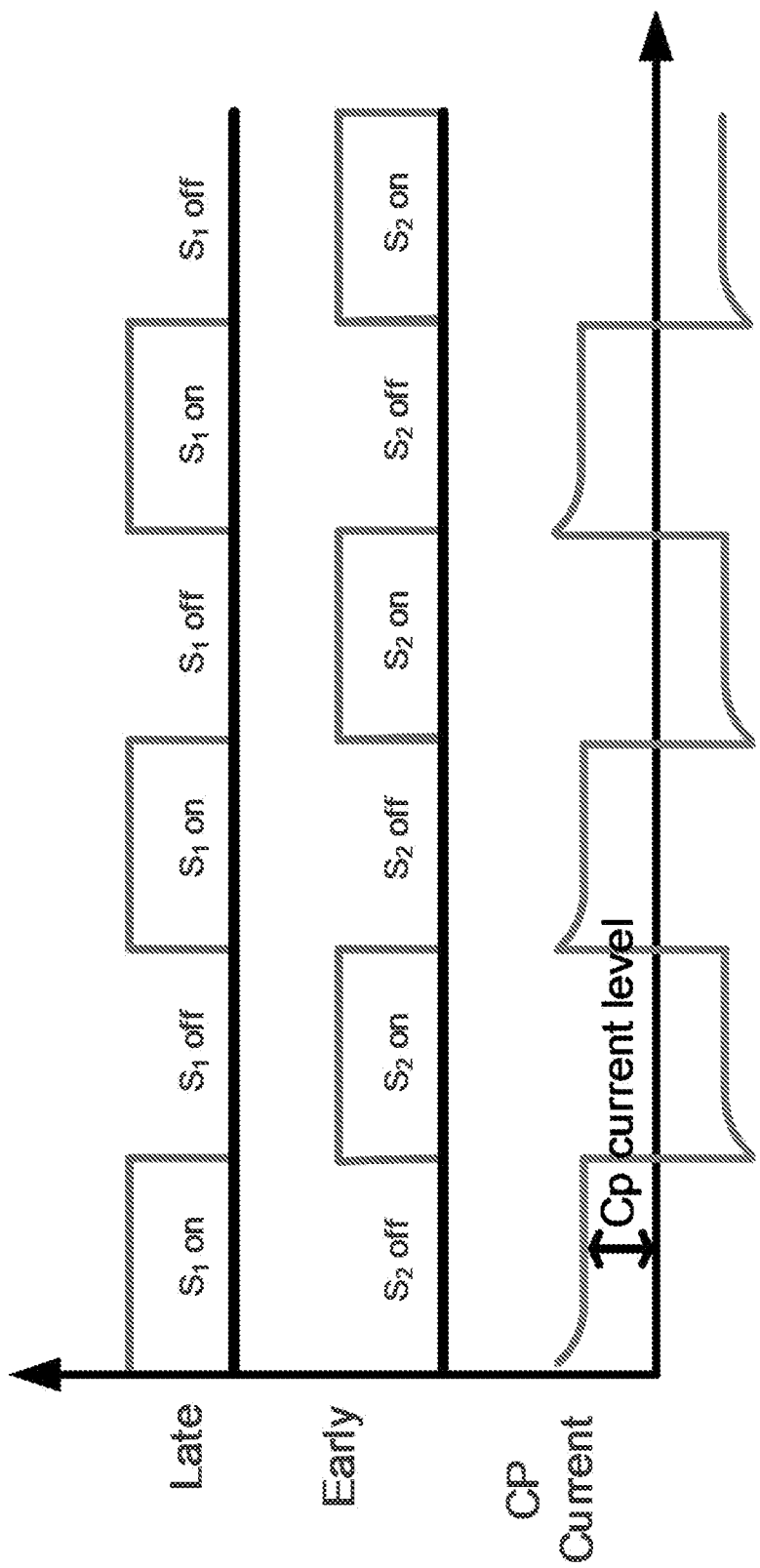
FIG. 5B is a timing diagram illustrating operation of an exemplary charge pump circuit according to embodiments of the present invention.

FIG. 5B is a timing diagram illustrating operation of an exemplary charge pump circuit according to embodiments of the present invention. This diagram is merely an example, which should not unduly limit the scope of the claims. One of ordinary skill in the art would recognize many variations, alternatives, and modifications. For example, the Late and Early signals are applied to switches $M_{P1}$, $M_{P2}$, $M_{N1}$, and $M_{N2}$. It is to be appreciated that the corresponding currents level at charge pump (CP) is stable with minimal "spiking".

As an example, the exemplary charge pump illustrated in FIG. 5A and described above can be readily incorporated into a CDR. For example, CDR 100 illustrated in FIG. 1 includes charge pump 104, which can be implemented using the charge pump illustrated in FIG. 5A. For example, phase detector 103 generates early and late signals, which charge pump 550 uses to generate an output current. For example, early and late signals from phase detector 103 are coupled to switches $M_{P1}$, $M_{P2}$, $M_{N1}$, and $M_{N2}$. The output of charge pump 550 will charge or discharge the LPF 105.

The use of charge pump 550 in CDR 100 is merely one of the implementations. It is to be appreciated that charge pump 550 and variations thereof according to embodiments of the present invention can be used in a variety of applications and implementations. For example, there are other CDR devices can be implemented using the design of exemplary charge pump 550. Charge pumps according to embodiments of the present invention can also be implemented in other applications. For example, CDRs implemented according to embodiments of the present invention are used in various data communication devices, such as transceivers, SerDes, receivers, and others.

Figure 6:
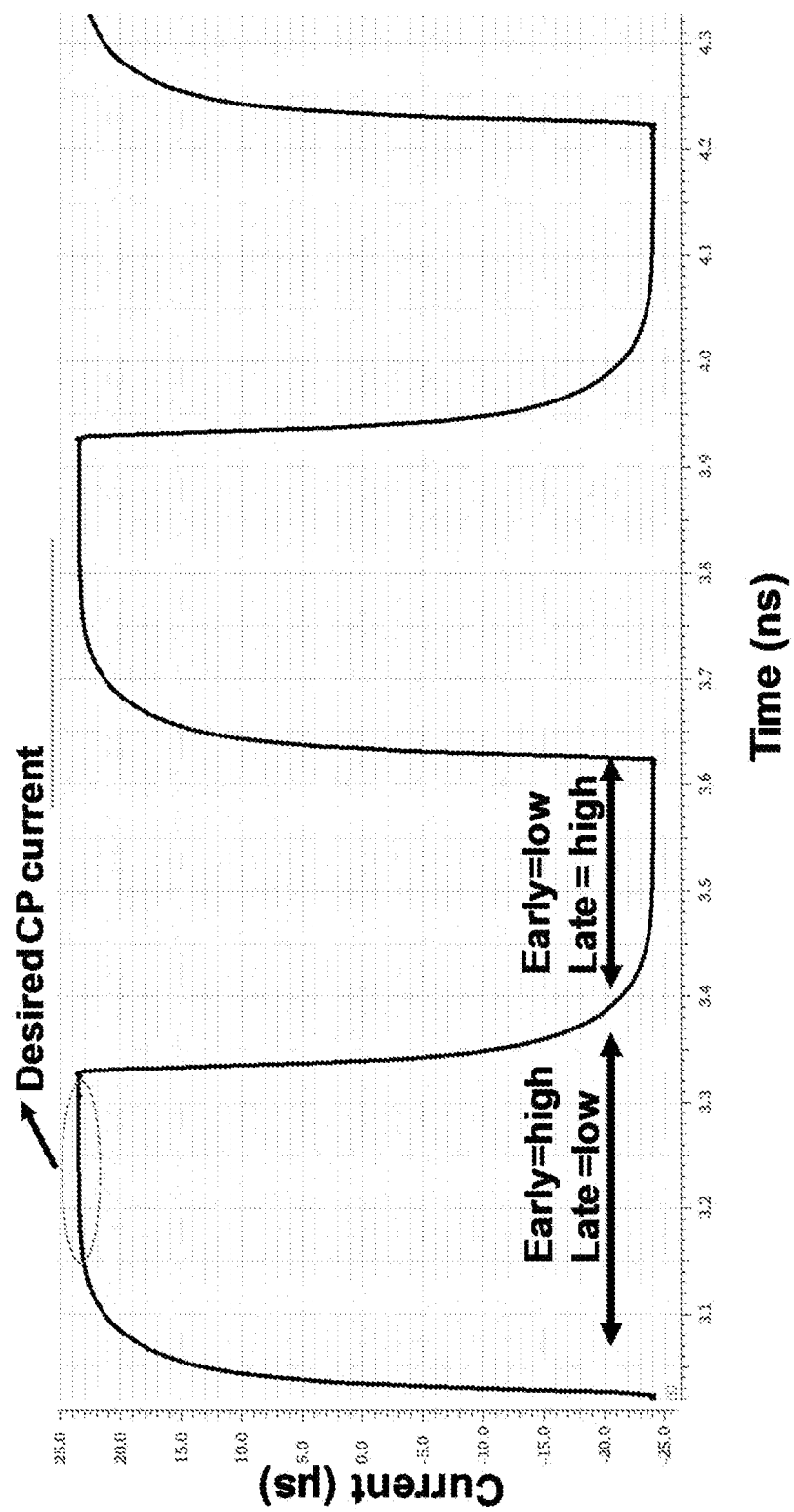
FIG. 6 is a graph illustrating charge pump current according to embodiments of the present invention.

FIG. 6 is a graph illustrating charge pump current according to embodiments of the present invention. The plot shows the charge-pump current corresponding to early and late signals. When the Early signal is high and Late is low, the current is positive, and vice versa. The desired current is about 23 µA, and as shown in FIG. 6, there is a negligible glitch current during Early to Late (or Late to Early) transition, which provides a significant advantage over the conventional charge pump designs.

Figure 7:
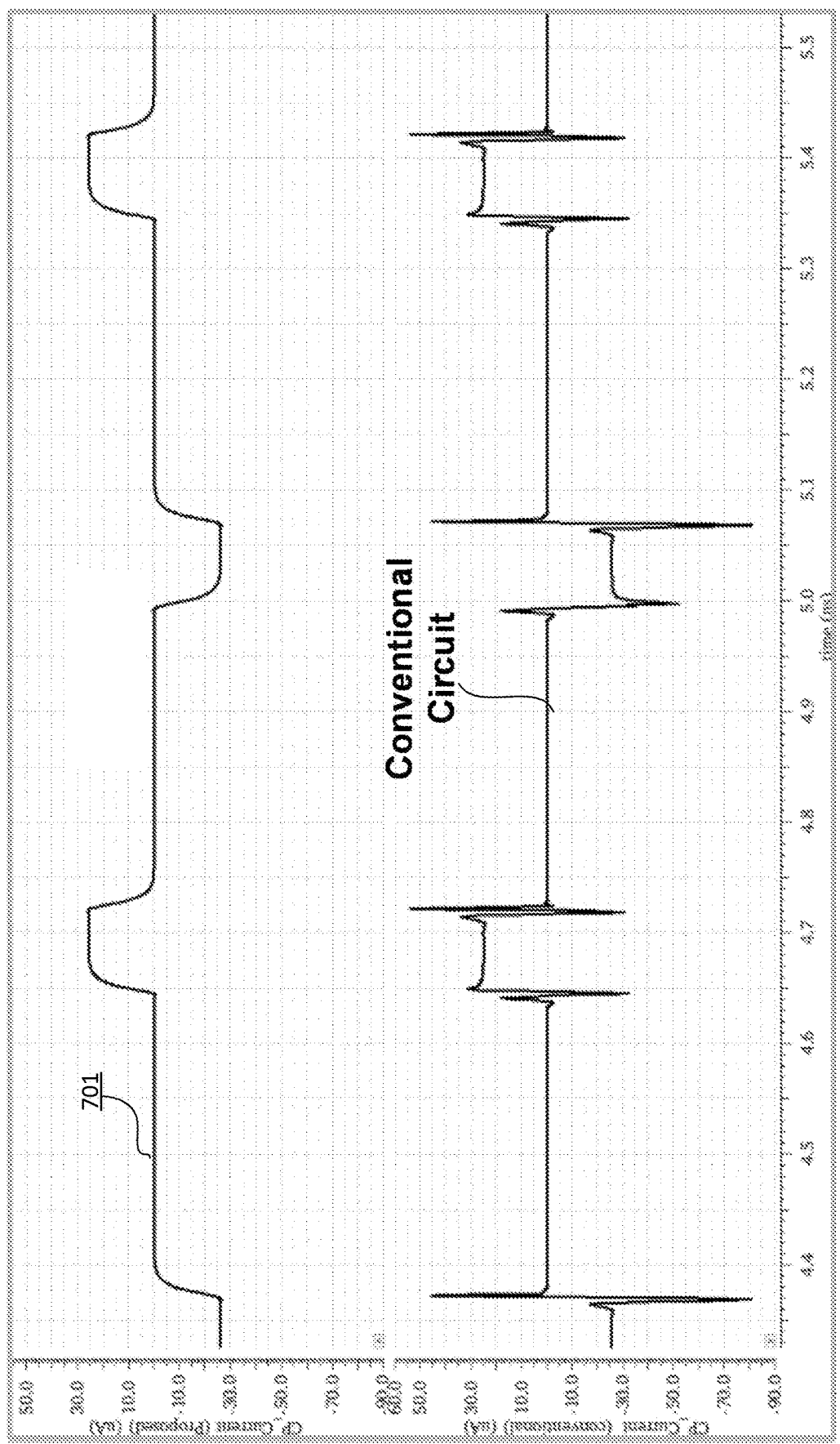
FIG. 7 is a graph illustrating performance of a charge pump according to embodiments of the present invention.

FIG. 7 is a graph illustrating performance of a charge pump according to embodiments of the present invention. Plot 701 shows that charge pump current from a charge pump according to embodiments of the present invention gradually reaches the desired current level during each of the transitions. In comparison, current from a conventional charge pump shows large undesirable current spikes that would lead to poor performance.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A clock data recovery circuit comprising:
   an input configured to receive a data signal;
   a voltage controlled oscillator comprising a clock;
   a phase detector configured to generate an early signal and a late signal, which are indicative of whether a phase of the clock of the voltage controlled oscillator is early or late relative to a phase of the data signal; and
   a charge pump comprising
      a first switch responsive to the early signal,
      a second switch responsive to the late signal,
      a pair of resistive elements connected in series between a drain of the first switch and a drain of the second switch to reduce glitch current at an output of the charge pump during transitions of the early signal and the late signal between high and low states, the pair of resistive elements configured to provide resistance between an output of the charge pump and the first switch and the second switch and to drive the voltage controlled oscillator, and
      a capacitor connected to the drain of the first switch and to a first resistive element of the pair of resistive elements, the first resistive element limiting an amount of charge flow from the output of the charge pump back through the first resistive element to the capacitor.

2. The clock data recovery circuit of claim 1, wherein:
   the charge pump further comprises a bias circuit configured to generate a first bias voltage and a second bias voltage;
   the first switch is configured to receive the first bias voltage; and
   the second switch is configured to provide an output at the second bias voltage.

3. The clock data recovery circuit of claim 2, further comprising a resistor configured to receive a portion of current output from the pair of resistive elements and to generate a voltage signal,
   wherein the bias circuit is configured to generate, based on the voltage signal, the first bias voltage and the second bias voltage.

4. The clock data recovery circuit of claim 2, wherein the bias circuit is configured to receive a control signal from a device separate from the charge pump and, based on the control signal, generate the first bias voltage and the second bias voltage.

5. The clock data recovery circuit of claim 1, wherein the charge pump synchronizes the phase of the clock of the voltage controlled oscillator with the phase of the data signal based on the early signal and the late signal received from the phase detector.

6. The dock data recovery circuit of claim 1, wherein the pair of resistive elements are configured to limit an amount of charge flow from the output of the charge pump back through the pair of resistive elements.

7. The clock data recovery circuit of claim 1, wherein:
   the pair of resistive elements comprise the first resistive element and a second resistive element;
   the first resistive element is configured to receive current output from the first switch; and
   the second resistive element is configured to receive a portion of current output from the first resistive element.

8. The clock data recovery circuit of claim 1, wherein the pair of resistive elements comprise a first resistor and a second resistor.

9. The clock data recovery circuit of claim 8, wherein the first resistor reduces the glitch current at the output of the charge pump during transitions of the early signal and the late signal between the high and low states.

10. A clock data recovery circuit comprising:
    an input configured to receive a data signal;
    a voltage controlled oscillator comprising a dock;
    a phase detector configured to generate an early signal and a late signal, which are indicative of whether a phase of the dock of the voltage controlled oscillator is early or late relative to a phase of the data signal; and
    a charge pump comprising
       a first switch responsive to the early signal,
       a second switch responsive to the late signal,
       a third switch responsive to an inverse of the early signal and configured to receive an output of the first switch in response to the early signal,
       a fourth switch responsive to an inverse of the late signal and configured to receive an output of the third switch in response to an inverse of the early signal,
       wherein the second switch is configured to receive an output of the fourth switch in response to an inverse of the late signal; and
       a pair of resistive elements connected in series between a drain of the first switch and a drain of the second switch to reduce glitch current at an output of the charge pump during transitions of the early signal and the late signal between high and low states, the pair of resistive elements configured to provide resistance between an output of the charge pump and the first switch and the second switch and to drive the voltage controlled oscillator.

11. The clock data recovery circuit of claim 10, further comprising:
 a first capacitor connected to an output of the third switch and to a ground reference terminal; and
 a second capacitor connected to an output of the first switch and to the ground reference terminal.

12. The clock data recovery circuit of claim 1, further comprising a low pass filter configured to filter current output from the charge pump,
 wherein the pair of resistive elements reduces an amount of glitch current received from the low pass filter.

13. The clock data recovery circuit of claim 1, further comprising:
 a data sampler configured to sample the data signal and generate an in-phase data signal; and
 an edge sampler configured to sample the data signal and generate a quadrature-phase data signal,
 wherein the phase detector is configured to generate the early signal and the late signal based on the in-phase data signal and the quadrature-phase data signal.

14. The clock data recovery circuit of claim 13, wherein:
 the voltage controlled oscillator is configured to generate clock signals;
 the clock signals comprise an in-phase clock signal and a quadrature-phase clock signal;
 the voltage controlled oscillator is configured to output the in-phase clock signal to the data sampler and the quadrature-phase clock signal to the edge sampler;
 the data sampler is configured to sample the data signal based on the in-phase clock signal; and
 the edge sampler is configured to sample the data signal based on the quadrature-phase clock signal.

15. A clock data recovery circuit comprising:
 an input configured to receive a data signal;
 a voltage controlled oscillator comprising a clock;
 a phase detector configured to generate an early signal and a late signal, which are indicative of whether a phase of the clock of the voltage controlled oscillator is early or late relative to a phase of the data signal;
 a bias circuit configured to generate a first bias voltage at a first terminal and a second bias voltage at a second terminal; and
 a charge pump comprising
  a first switch connected to the first terminal, responsive to the early signal, and s configured to receive the first bias voltage and switch between states based on the early signal,
  a second switch connected to the second terminal, responsive to the late signal, and configured to provide an output at the second bias voltage based on the late signal, and
  a pair of resistive elements connected in series between a drain of the first switch and a drain of the second switch to reduce glitch current at an output of the charge pump during transitions of the early signal and the late signal between high and low states, the pair of resistive elements configured to provide resistance between an output of the charge pump and the first switch and the second switch and to drive the voltage controlled oscillator.

16. The clock data recovery circuit of claim 15, wherein:
 the pair of resistive elements comprise a first resistive element and a second resistive element;
 the first resistive element is connected to receive an output of the first switch and is configured to provide resistance between an output of the charge pump and the first switch, drive the voltage controlled oscillator, and reduce glitch current at the output of the charge pump;
 the second resistive element is connected in series with the first resistive and is configured to provide resistance between the output of the charge pump and the second switch; and
 the second switch is configured to receive an output of the second resistive element.

17. The clock data recovery circuit of claim 1, further comprising a plurality of samplers, wherein:
 the voltage controlled oscillator is configured to generate clock signals based on current output from the charge pump;
 the plurality of samplers are configured to sample, based on the dock signals, the data signal received at the input of the clock data recovery circuit to generate a plurality of data signals; and
 the phase detector is configured to generate, based on the plurality of data signals, the early signal and the late signal.

18. The clock data recovery circuit of claim 15, wherein the bias circuit comprises:
 a third switch configured to output the first bias voltage; and
 a fourth switch configured to output the second bias voltage.

19. The clock data recovery circuit of claim 18, wherein:
 an output terminal of the third switch is connected to an input terminal of the first switch; and
 an input terminal of the fourth switch is connected to an output terminal of the second switch.

\* \* \* \* \*